(12) United States Patent
Yu

(10) Patent No.: US 6,950,307 B2
(45) Date of Patent: Sep. 27, 2005

(54) FASTENING STRUCTURE FOR A HEAT SINK

(75) Inventor: Che-Min Yu, Hsin-Chuang (TW)

(73) Assignee: Datech Technology Co., Ltd., Taipei Hsien (TW)

(*) Notice: Subject to any disclaimer, the term of this patent is extended or adjusted under 35 U.S.C. 154(b) by 392 days.

(21) Appl. No.: 10/294,680

(22) Filed: Nov. 15, 2002

(65) Prior Publication Data
US 2004/0037041 A1 Feb. 26, 2004

(30) Foreign Application Priority Data
Aug. 16, 2002 (TW) .................... 91212781 U

(51) Int. Cl.$^7$ ............................... H05K 7/20
(52) U.S. Cl. ............ 361/704; 361/709; 361/720; 165/80.3; 257/706
(58) Field of Search .................. 361/702–712, 361/717–719, 722–724; 165/80.3, 80.4, 165; 24/295, 457, 458, 495, 505, 517; 174/16.3; 257/707–718, 720–727; 248/316.7, 505, 510; 29/525.01–525.04

(56) References Cited

U.S. PATENT DOCUMENTS

| 5,280,409 | A | * | 1/1994 | Selna et al. | 361/720 |
|---|---|---|---|---|---|
| 5,638,258 | A | * | 6/1997 | Lin | 361/704 |
| 5,933,326 | A | * | 8/1999 | Lee et al. | 361/704 |
| 5,953,212 | A | * | 9/1999 | Lee | 361/709 |
| 6,108,207 | A | * | 8/2000 | Lee | 361/704 |
| 6,208,518 | B1 | * | 3/2001 | Lee | 361/704 |
| 6,318,452 | B1 | * | 11/2001 | Lee | 165/80.3 |
| 6,400,572 | B1 | * | 6/2002 | Wu | 361/704 |
| 6,404,635 | B1 | | 6/2002 | Wei | |
| 6,418,022 | B1 | * | 7/2002 | Chen | 361/704 |
| 6,452,801 | B1 | * | 9/2002 | Chen | 361/704 |
| 6,483,703 | B2 | * | 11/2002 | Hsu | 361/704 |
| 6,771,506 | B2 | * | 8/2004 | Lee et al. | 361/704 |
| 6,808,012 | B1 | * | 10/2004 | Chen et al. | 165/80.3 |
| 2002/0126451 | A1 | * | 9/2002 | Hsu | 361/704 |
| 2002/0159234 | A1 | * | 10/2002 | Chen | 361/704 |
| 2003/0070265 | A1 | * | 4/2003 | Lin | 24/458 |

* cited by examiner

Primary Examiner—Michael Datskovskiy
(74) Attorney, Agent, or Firm—Troxell Law Office, PLLC

(57) ABSTRACT

The present invention herein relates to fastening structure for a heat sink to provide a fastening structure easy and convenient both for assembling and disassembling operation, characterized by fastening structure being a material of elasticity comprising a controlling member and a motioning member, wherein controlling member is composed of a reinforcing loop, a operational portion of controlling member and a first radian claw, a motioning member buckling up controlling member is composed of a operational portion of motioning member and a second radian claw, heat sink for assembling and disassembling operate in coordination with a first radian claw, a second radian claw and a reinforcing loop

3 Claims, 7 Drawing Sheets

FASTENING STRUCTURE FOR A HEAT SINK

REFERENCE CITED

U.S. Pat. No. 6,404,635

FIELD OF THE INVENTION

The present invention is related to fastening structure for a heat sink to computer CPU, more particularly, related to heat sink for assembling and disassembling operation.

BACKGROUND OF THE INVENTION

Due to the continuous development of computer technology and the enhancement of integrated circuit production technology, CPU execution speeds are always increasing. Thus, the amount of heat generated rises in direct proportion. If the rate of CPU heat dissipation is insufficient, the computer operating stability will be affected. As a result, the most direct and easy solution for solving the problem of CPU overheating is to use a heat sink to dissipate the high temperature produced by the CPU.

The conventional fastening structure for a heat sink currently available has two mainly type. As shown in FIG. 1A, that is constructed of rivet joint 1a with drilling of heat sink 1. Due to the requirement of drilling and location, the cost of manufacture is high, that is not only size of diameter and strength of material, but also high thermo resistance of rivet joint 1a to cause negative effect on the rate of heat dissipation by heat sink 1. Besides, the procedure of rivet joint 1a for heat sink 1 is complex, and resulting not only being not disassembled, but also wasting material consumption when drilling. As shown in FIG. 1B, that is constructed of fastener with being composed of a clip 11, a drilling 13 and a fastener 12 for heat sink 1. Due to the requirement of drilling and location, the cost of manufacture is high. Please referring to FIG. 1C, that is obvious advantage with no drilling, however, it is inconvenient to use upright force 14 and side force 15 at same position for assembling and disassembling of heat sink operation. Wen-Chen Wei, U.S. Pat. No. 6,404,635, Heat sink device fastening structure, that is also inconvenient to use force at same position for assembling and disassembling of heat sink operation.

In view of the various disadvantages of conventional heat sink in terms of fastening structure, the present invention addresses the disadvantages by researching solutions for them which, following continuous research and improvements, culminated in the development of the improved fastening structure easy and convenient both for assembling and disassembling to heat sink operation of the invention herein, a structure capable of eliminating the numerous drawbacks of the conventional technology.

OBJECT OF THIS INVENTION

Due to the continuous development of computer technology and the enhancement of integrated circuit production technology, CPU execution speeds are always increasing. The heat sink will be attached to the CPU to dissipate the high temperature produced by the CPU, Thus, the fastening structure for a heat sink is to be of great urgency.

Therefore, the main object of the present invention is to provide high efficiency of heat dissipation, fastening structure easy and convenient both for assembling and disassembling operation and low-cost manufacture of fastening structure.

Another object of the present invention is to provide heat sink for assembling and disassembling operate in coordination with a first radian claw, a second radian claw and a reinforcing loop.

SUMMARY OF THE INVENTION

Specifically, the present invention provides a fastening structure to provide a heat sink for assembling and disassembling, characterized by said fastening structure being a material of elasticity comprising a controlling member and a motioning member, wherein said controlling member is composed of a reinforcing loop, a operational portion of controlling member and a first radian claw, said a motioning member buckling up said controlling member is composed of a operational portion of motioning member and a second radian claw, said heat sink for assembling and disassembling operate in coordination with a first radian claw, a second radian claw and a reinforcing loop.

BRIEF DESCRIPTION OF THE DRAWINGS

The present invention will be better understood from the following detailed description of preferred embodiments of the invention, taken in conjunction with the accompanying drawings, in which.

DESCRIPTION OF THE PREFERRED EMBODIMENTS

According to the disadvantages of conventional fastening structure as described above, the present invention provides an improvement solution for that. Embodiments of this invention will be described in detail with reference to attached drawings.

Figure 1A:
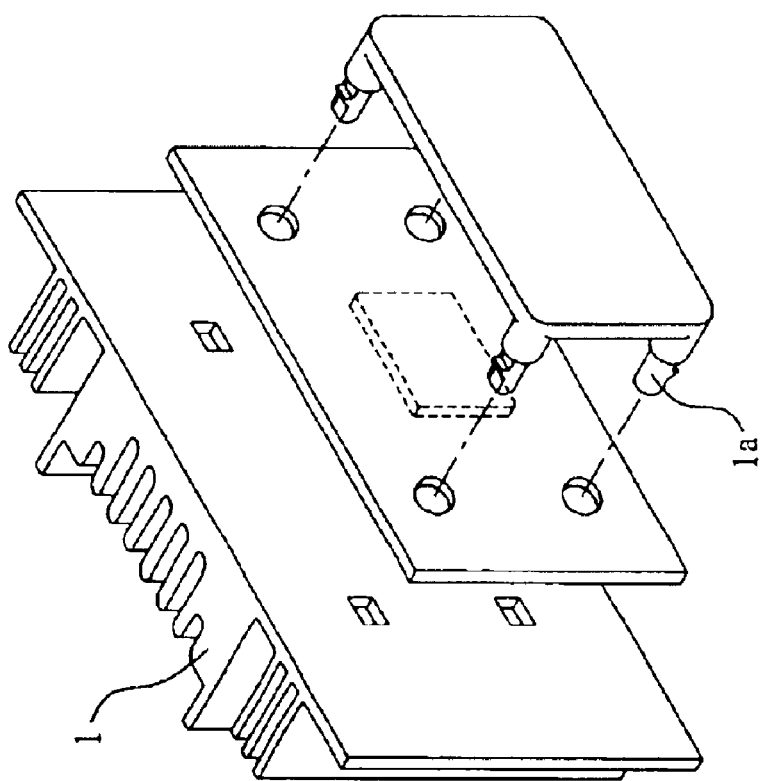
FIG. 1A is a perspective diagram of a heat sink with rivet joint in accordance with the conventional structure.
Figure 1B:
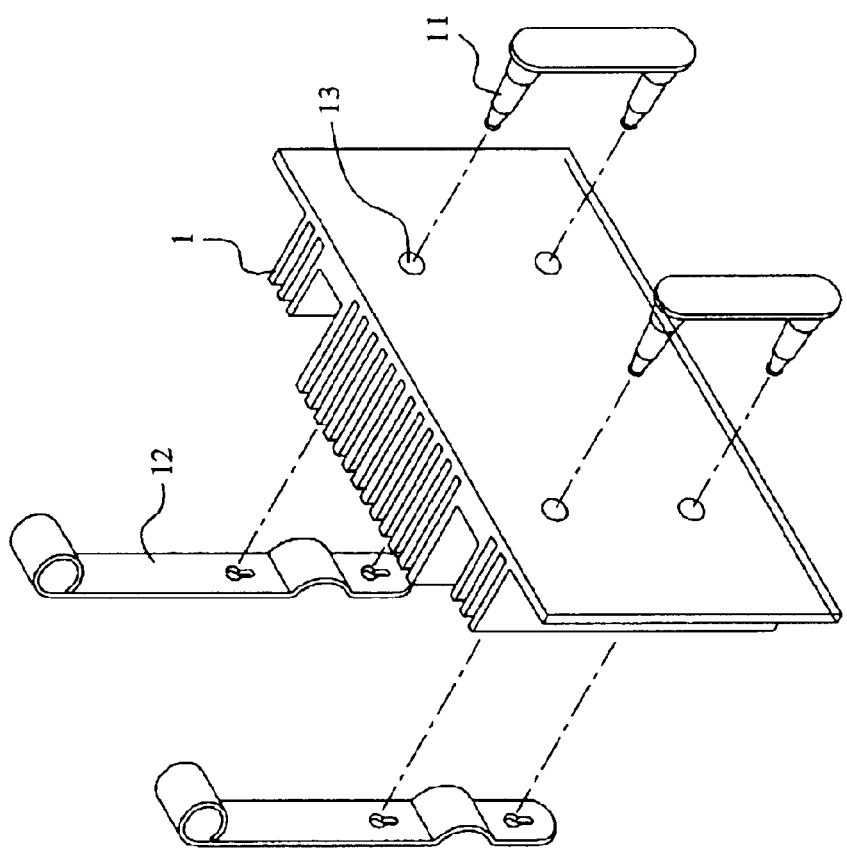
FIG. 1B is a perspective diagram of a heat sink with fastener and hole in accordance with the conventional structure.
Figure 1C:
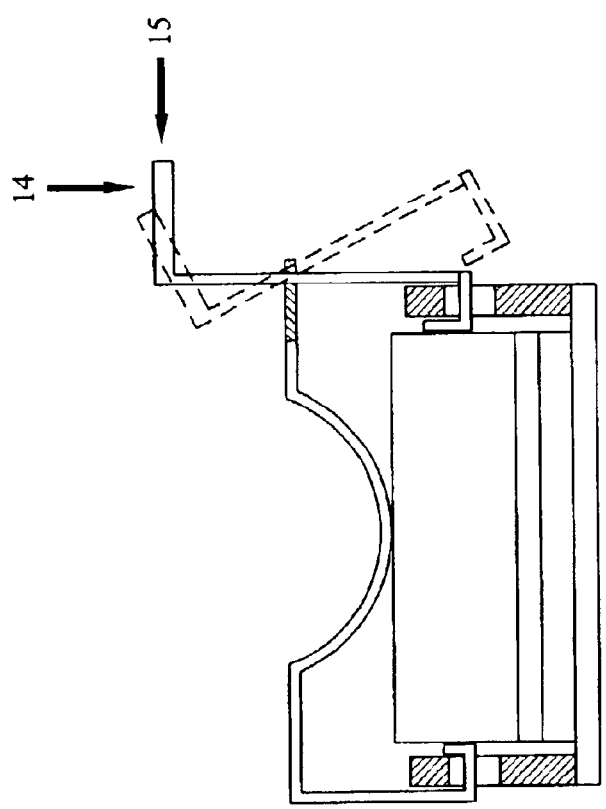
FIG. 1C is a perspective diagram of a heat sink with fastener in accordance with the conventional structure.
Figure 2A:
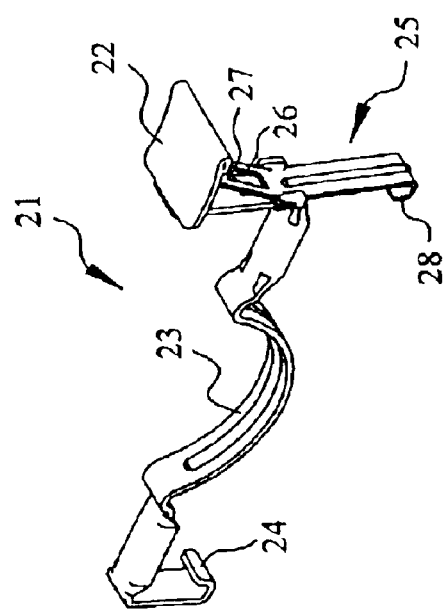
FIG. 2A is a perspective diagram of fastening structure in accordance with the present invention.

Please referring to FIG. 2A of fastening structure in accordance with the present invention, it provides a heat sink for assembling and disassembling, characterized by: said fastening structure being a material of elasticity comprising a controlling member 21 and a motioning member 25, wherein said controlling member 21 is composed of a reinforcing loop 23, an operational portion of the controlling member 22 and a first radian claw 24, said a motioning member 25 buckling up said controlling member 21 is composed of an operational portion of the motioning member 26 and a second radian claw 28, said heat sink for assembling and disassembling operate in coordination with a first radian claw 24, a second radian claw 28 and a reinforcing loop 23, wherein motioning member 25 further comprises reed for automatic return mechanism 27, and the fastening structure is installed in two-side or inner heat sink.

Figure 3A:
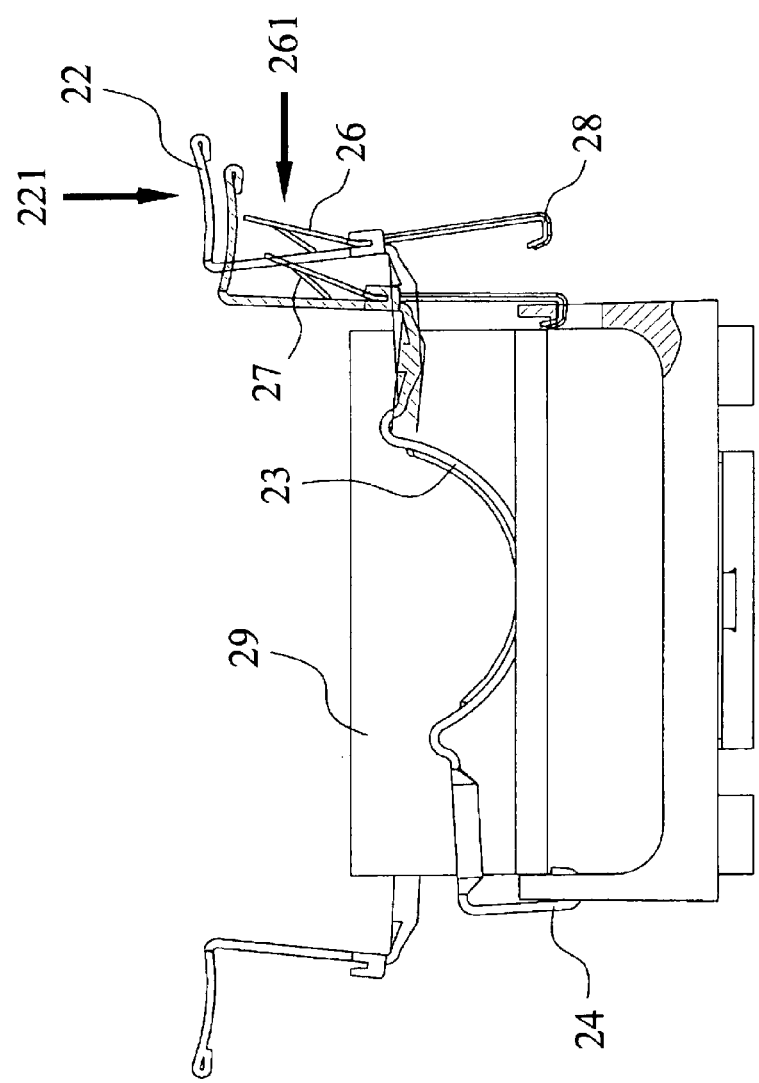
FIG. 3A is a perspective view of procedure of heat sink for assembling in accordance with the present invention.
Figure 3B:
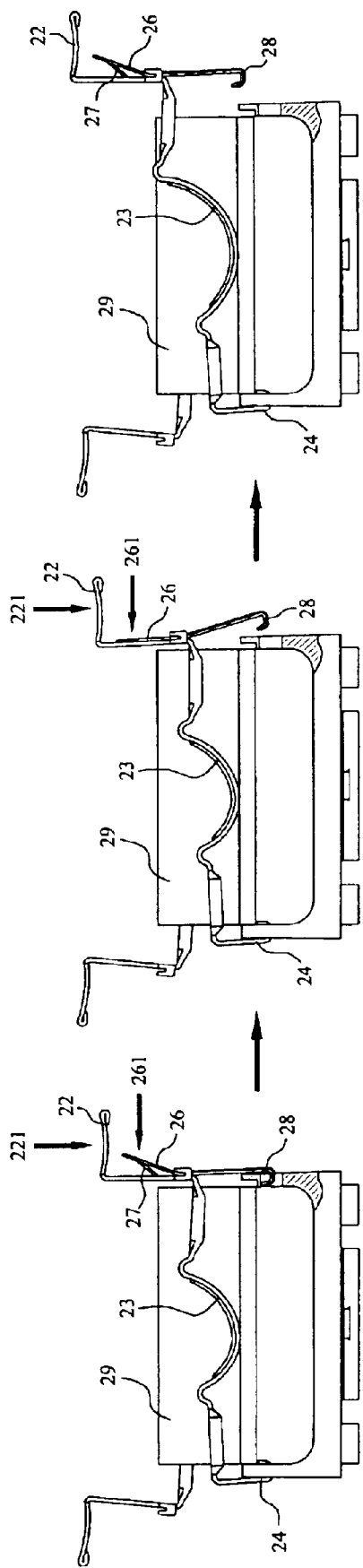
FIG. 3B is a perspective view of procedure of heat sink for disassembling in accordance with the present invention.

Please seeing the FIG. 3A of procedure of heat sink for assembling in accordance with the present invention, it shows heat sink for assembling operation in coordination with a first radian claw 24, a second radian claw 28 and a reinforcing loop 23, the procedure of said heat sink for assembling comprising: a first radian claw 24 and a reinforcing loop 23 to be installed in location; a upright force 221 to said operational portion of controlling member 22 and then a side force 261 to said operational portion of motioning member 26 for installing said second radian claw 28; and finishing of heat sink for assembling. Next, please referring to the FIG. 3B of procedure of heat sink for disassembling in accordance with the present invention, it shows heat sink for disassembling operation in coordination with a first radian claw 24, a second radian claw 28 and a reinforcing loop 23, the procedure of said heat sink for disassembling comprising: a upright force 221 to said operational portion of controlling member 22 and meantime a side force 261 to said operational portion of motioning member 26 for departing from said second radian claw 28; a first radian claw 24 and a reinforcing loop 23 to be departed from location; and finishing of heat sink for disassembling.

Figure 2B:
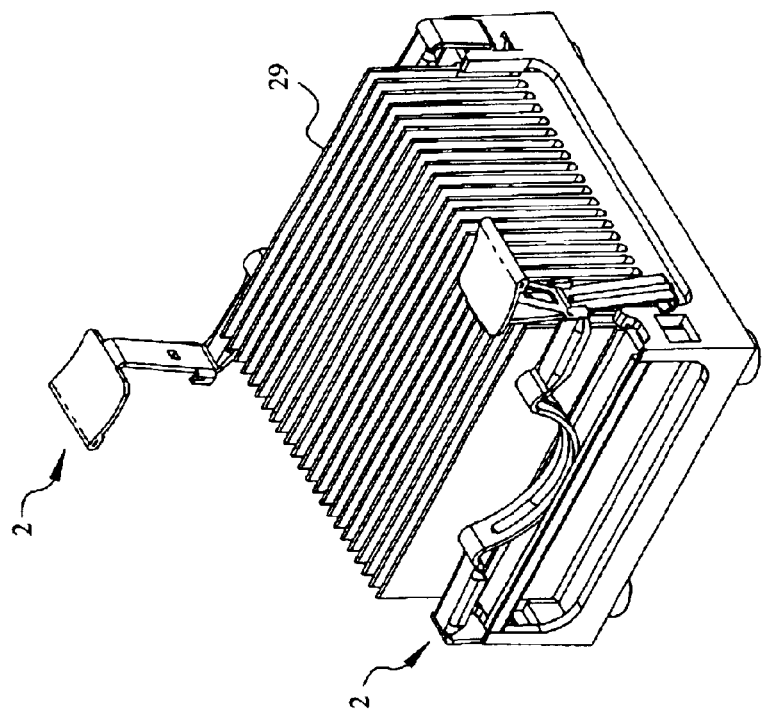
FIG. 2B is a perspective view of fastening structure for a heat sink of an embodiment of the present invention.

Besides, please referring to FIG. 2B, this invention fastening structure 2 is installed in two-side heat sink 29. However, as the person skilled in the art may disclose for installing in both horizontal and vertical direction.

In summation of the foregoing section, the invention herein fully complies will all new patent application requirement and is hereby submitted to the patent bureau for review and the granting of the commensurate patent rights.

The present invention may be embodied in other specific forms without departing from the spirit of the essential attributes thereof; therefore, the illustrated embodiment should be considered in all respects as illustrative and not restrictive, reference being made to the appended claims rather than to the foregoing description to indicate the scope of the invention.

What is claimed is:

1. A fastening structure to provide a heat sink for assembling and disassembling, comprising:

said fastening structure being made of a material of elasticity and having a controlling member and a motioning member, wherein said controlling member is composed of a reinforcing loop, an operational portion of the controlling member and a first radian claw, said a motioning member buckling up said controlling member is composed of an operational portion of the motioning member and a second radian claw, said heat sink for assembling and disassembling operate in coordination with a first radian claw, a second radian claw and a reinforcing loop, wherein said motioning member further comprises a reed for automatic return mechanism.

2. The fastening structure according to claim 1, wherein said fastening structure is installed in two-side heat sink.

3. The fastening structure according to claim 1, wherein said fastening structure is installed in inner heat sink.

* * * * *